(12) United States Patent
Daniels et al.

(10) Patent No.: US 8,242,789 B2
(45) Date of Patent: Aug. 14, 2012

(54) PLASMA SYSTEM AND MEASUREMENT METHOD

(75) Inventors: Stephen Daniels, Dublin (IE); Justin Lawler, County Dublin (IE); Victor John Law, County Westmeath (IE)

(73) Assignee: Dublin City University, Dublin (IE)

( * ) Notice: Subject to any disclaimer, the term of this patent is extended or adjusted under 35 U.S.C. 154(b) by 432 days.

(21) Appl. No.: 12/312,790

(22) PCT Filed: Nov. 26, 2007

(86) PCT No.: PCT/IE2007/000116
§ 371 (c)(1),
(2), (4) Date: Jun. 25, 2009

(87) PCT Pub. No.: WO2008/065635
PCT Pub. Date: Jun. 5, 2008

(65) Prior Publication Data
US 2010/0033194 A1    Feb. 11, 2010

(30) Foreign Application Priority Data

Nov. 27, 2006  (IE) .................................... 2006/0855

(51) Int. Cl.
*G01R 27/04* (2006.01)
(52) U.S. Cl. ........................ 324/642; 324/637
(58) Field of Classification Search .................. 324/642, 324/76.11, 637
See application file for complete search history.

(56) References Cited

U.S. PATENT DOCUMENTS

| 3,613,026 A * | 10/1971 | Skolnick et al. ................ 372/32 |
| 4,507,588 A * | 3/1985 | Asmussen et al. .............. 315/39 |
| 5,691,642 A | 11/1997 | Dobkin |
| 5,705,931 A | 1/1998 | Klick |
| 6,826,489 B2 | 11/2004 | Scanlan et al. |
| 2003/0141822 A1* | 7/2003 | Sirkis et al. ............. 315/111.21 |
| 2005/0009347 A1* | 1/2005 | Matsumoto et al. ......... 438/689 |
| 2005/0019961 A1 | 1/2005 | Davis et al. |
| 2006/0012308 A1 | 1/2006 | Ilic et al. |

FOREIGN PATENT DOCUMENTS

EP    0 957 184    11/1999

OTHER PUBLICATIONS

International Search Report dated Jun. 10, 2008.

\* cited by examiner

*Primary Examiner* — Vincent Q Nguyen
(74) *Attorney, Agent, or Firm* — Jacobson Holman PLLC

(57) ABSTRACT

A plasma system (1) has a circuit including a DC source (6), a power supply line (9), an electrodes (2, 3), and a return line (18). A perturbation signal source (8) delivers a perturbation signal into the circuit in addition to DC voltage from the DC source (6). Acquisition (10) and analysis (11) systems measure response to the perturbation. The analysis system (11) measures variation in impedance of the circuit and phase between voltage and current in the circuit. It also uses a frequency domain reflectrometry technique to measure signal reflection modulus of a supply line of the circuit over a defined frequency range.

24 Claims, 6 Drawing Sheets

PLASMA SYSTEM AND MEASUREMENT METHOD

This is a national stage of PCT/IE07/000,116 filed Nov. 26, 2007 and published in English, which has a priority of Irish no. 2006/0855 filed Nov. 27, 2006, hereby incorporated by reference.

FIELD OF THE INVENTION

The invention relates to DC plasma reactors, and more particularly to measurement of their states.

PRIOR ART DISCUSSION

DC plasma reactors (or simply "DC plasmas") are used in a wide variety of applications in a range of industries including semiconductor device manufacture, application of anti-reflective coatings onto glass, manufacture of magnetic and optical storage media, cleaning surfaces and surface activation of polymers to enhance adhesion of coatings. These applications involve etching of material from surfaces, deposition of coatings and modification of existing material on a surface. The process typically involves placing the material to be treated inside a sealed chamber in which a controlled amount of gas is introduced. Electrical power is supplied to an electrode and/or material to be treated to form a plasma. The material to be processed may form the electrode or be placed separately within the chamber. A plasma reactor may be supplied with a plurality of electrical power sources though a plurality of power coupling means (e.g. electrodes) to form the plasma. The plasma is a mixture of ions, electrons, neutral gas atoms as well as radical species, which allow the desired process to take place.

Electrical current delivered to the plasma must return to ground/earth to complete the circuit. As the chamber body is often a primary return path for the power used to form the plasma it also forms part of the electrical circuit. This introduces additional parameters that can contribute to the plasma's properties. The properties of the plasma are a function of a number of parameters including: power delivered, gas mixture and flow rates, gas pressure, substrate and chamber temperature, chamber wall condition, and electrode spacing.

Control of the plasma is a key part of producing reliable, repeatable and predictable results in manufacturing environments. Repeatable plasmas will produce repeatable production. Unfortunately there are few measurement techniques available that can provide the necessary information on the state of the plasma or identify variations in the plasma and their sources. Typically control is achieved by controlling the sources of inputs into the system (gas flow, pumping speed, power level etc). These are commonly referred to as process parameters or process inputs. These have the disadvantage of being indirect measurements of the plasma as the actual process performance is dependant on the plasma parameters. Current practice is for deviations in process performance to be rectified through lengthy manual intervention and replacement of parts to ascertain the source of deviation from specification. This is time-consuming and expensive.

To date some success has been achieved with plasma systems using RF power sources by measurement of the electrical characteristics. Plasmas act as complex loads and produce harmonic Fourier components of the fundamental drive frequency. Measurement of the electrical characteristics of the plasma system at the fundamental frequency and at harmonic frequencies can allow limited measurement of the plasma behaviour (U.S. Pat. No. 6,826,489).

The monitoring of RF plasma parameters is fundamentally a passive measurement i.e. it is measuring the response of the plasma to the process inputs. Therefore these techniques are limited to characterising the system only at the fundamental and the plurality of harmonic components and also by the ability to resolve the Fourier components at different frequencies i.e. if there is no measurable harmonic generation at a particular frequency there is no way to characterise the plasma at that frequency. The latter is particularly relevant to high frequencies as there is a tendency for the intensity of harmonic generated by the non-linear plasma load to decay with increasing frequency.

Other techniques for RF-generated plasmas use probes mounted on the side of the plasma chamber and monitor signals from the plasma directly (U.S. Pat. No. 5,705,931). These are limited by their localised sensitivity and the amount of information they can produce.

For plasmas produced using DC power supplies control of the plasma process is generally achieved by measurement of the process inputs and post-process measurement of the material being processed to ensure compliance to specification. Deviations from specification are responded to by suspension of processing and repair of the system to bring the process back into compliance with the specification. Pulsed DC plasmas can use RF measurement techniques but these suffer from the added complexity of the ability and often requirement to vary pulse lengths and frequency. This alters the measurement basis and makes comparisons between measurements difficult.

The invention is therefore directed towards providing improved measurement of DC plasma systems.

SUMMARY OF THE INVENTION

According to the invention, there is provided a plasma system comprising a circuit including a DC source, a power supply line, an electrode means, and a return line, wherein the system further comprises a perturbation signal source for delivering a perturbation signal into the circuit in addition to DC voltage from the DC source, and a measurement means for measuring response to the perturbation.

In one embodiment, the measurement means comprises means for measuring variation in impedance of the circuit.

In one embodiment, the measurement means comprises means for measuring phase between voltage and current in the circuit.

In one embodiment, the measurement means comprises means for using a frequency domain reflectrometry technique to measure signal reflection modulus of a supply line of the circuit over a defined frequency range.

In one embodiment, the magnitude of the perturbation signal is small compared to the plasma driving signal.

In one embodiment, the perturbation source is connected to the supply line.

In one embodiment, the perturbation source is connected to the return line.

In one embodiment, the measurement means is connected to the supply line.

In one embodiment, the measurement means is connected to the return line.

In one embodiment, the circuit includes a coupler for coupling a perturbation signal into the circuit, said coupler blocking the DC power from the perturbation source.

In one embodiment, the measurement means is connected to the coupler.

In one embodiment, the measurement means comprises a vector network analyser for measuring both magnitude and phase of plasma reactor response, and a scalar network analyser for measuring magnitude of the response.

According to another aspect, the invention provides a method of measuring DC plasma conditions in any DC plasma system as defined above, the method comprising the steps of:
- delivering both DC voltage and a perturbation to the electrode means to bring about a plasma reactor, and
- measuring response to the perturbation.

In one embodiment, variation in impedance of the circuit is measured.

In one embodiment, the electrode means is arranged to perform sputtering, and the method measures progress of sputtering by monitoring a variation induced in the perturbing signal and correlating it with process variations such as sputtering electrode target surface condition or process pressure.

In one embodiment, the method comprises the step of measuring shift in frequency components of the perturbing signal to provide a measure of the change in an electrical equivalent circuit.

In one embodiment, the method comprises the step of the measurement means calibrating the system in response to measurement of said shifts.

In one embodiment, the method comprises the step of the measurement means interpreting said measurements to provide an indication of a physical change in plasma or in a plasma-surface interface.

In one embodiment, when delivered power is in an off state and plasma has extinguished measurements are made of the power delivery line and incumbent stray capacitances, and when a power pulse is delivered and plasma forms, measurements are made of the resulting on state to provide an indication of the response of the reactor to this change.

In one embodiment, the measurement means records the response of the plasma reactor to the perturbation signal reflected from the return path to achieve sensitivity to changes in the processed materials characteristics.

In one embodiment, with no power delivered from the power supply and no plasma present in the chamber measurements are made while systematically changing component parts of the hardware in order to simulate fault conditions such as electrode wear, power delivery line failure, and contributors to stray capacitances around the power delivery line and electrode.

In one embodiment, the method comprises the step of the measurement means measuring reactor characteristic response to a plurality of perturbation signal frequencies caused by sweeping of the perturbation signal.

In one embodiment, the measurement means comprises a vector network analyser and said analyser measures both magnitude and phase of the plasma reactor response, and the measurement means comprises a scalar network analyser which measures the magnitude of the response.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

Figure 1:
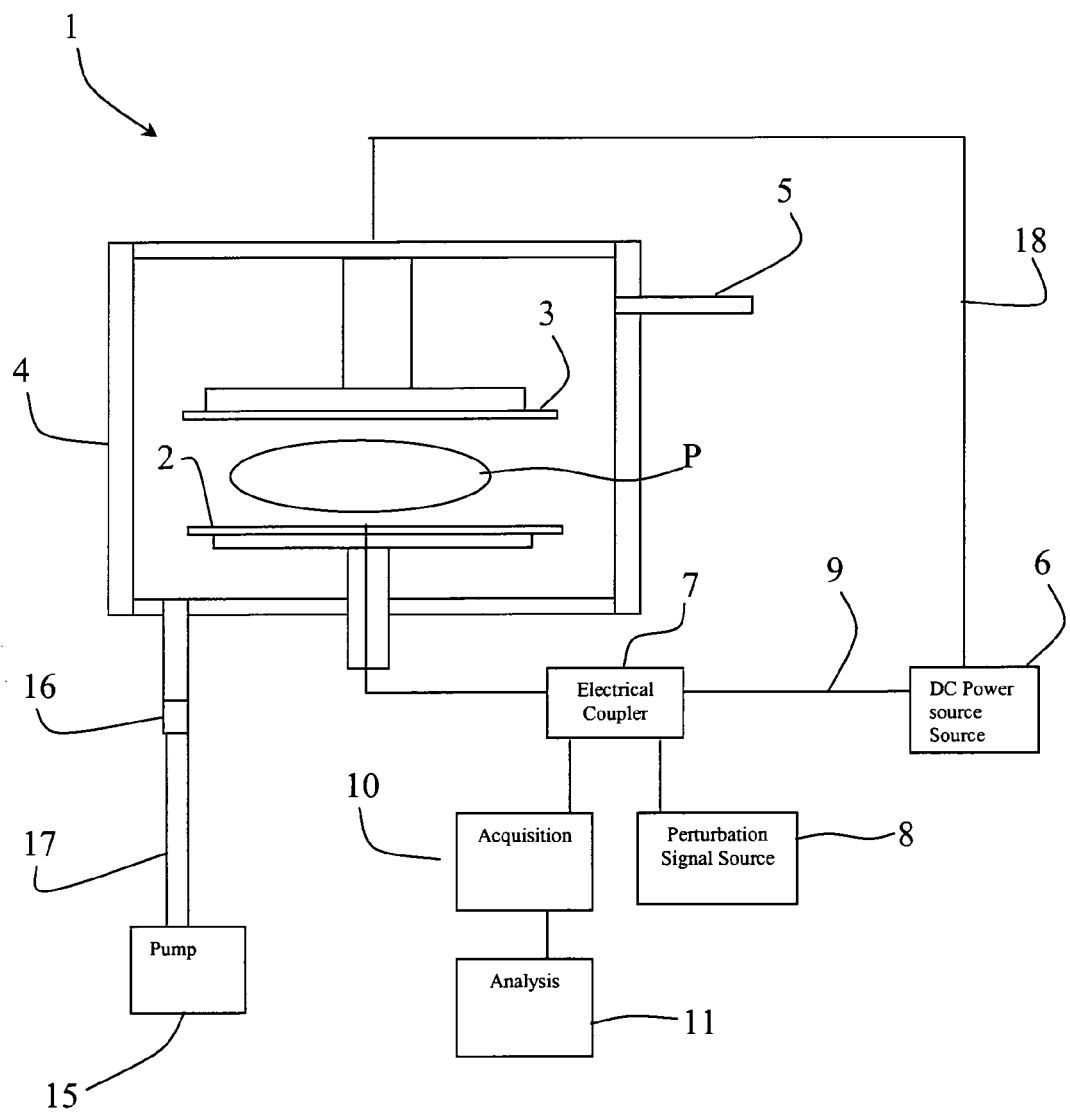
FIG. 1 is a diagram illustrating a plasma system of the invention.

Referring to FIG. 1 a plasma reactor system 1 comprises electrodes 2 and 3 within a DC plasma reactor chamber 4 having a process gas inlet 5. Power is delivered by a DC power source 6. An electrical coupler 7 couples the DC power with a perturbation signal from a source 8 on a power delivery line 9. There is also a measurement means, namely an acquisition system 10 and an analysis system 11. The system 1 also comprises a pump 15 for pumping exhaust gas through a throttle valve 16 in an exhaust line 17. The return path from the electrode 3 is indicated by the numeral 18.

The source 8 introduces onto the line 9 an electrical perturbation which is a swept frequency signal with specific step resolution. Alternatively, the perturbation signal may be a low-level RF signal: sinusoidal, pulsed or saw-tooth, or a non-repetitive pulsed source The acquisition system 10 is a scalar network analyser, but may alternatively be a vector network analyser or a time-dependant storage means. The perturbation source 8 is generally repetitive, particularly where measurements of the response are made dependent on the frequency of the perturbation signal. Alternatively a non-repetitive perturbation signal may be used, particularly to measure the time-dependant response of the plasma reactor to the perturbation signal. This measurement is performed while power is applied to the system, to detect and classify faults in a plasma reactor system.

The perturbation signal is typically at a sufficiently low level as to be non-intrusive i.e. it does not measurably or significantly alter the plasma processing.

A power delivery circuit formed when there is a plasma P present in the reactor includes the power delivery line 9 to the electrode 2, the plasma P, the material being treated (electrode) 3, ground return paths through the chamber 4 and stray capacitances and inductances of component parts adjacent to the power source 6, and the return path 18.

The perturbation signal is introduced onto the power delivery line 9 via the coupler 7. The coupler 7 is an electrical coupler, however alternatively it may be a directional device such as a directional coupler, hybrid transformer, or an RF bridge. The coupler 7 ensures that power to be delivered to the plasma reactor is not coupled into the perturbation signal source 8 or the acquisition system 10 and that the distorted response is not coupled into the power source 6. The coupler 7 consists of a single unit performing both functions, but may alternatively comprise a plurality of units each performing a separate function for the injection and extraction of the perturbation signal. For this embodiment the recorded distorted response of the plasma reactor to the perturbation signal is a measurement of its reflection from the power delivery line 9.

The response of the rector to the perturbation signal is dependant on the component parts of the power delivery circuit. Where the perturbation is applied to the powered electrode 2 (e.g. a target or material being processed) the measurement is sensitive to the electrical and physical characteristics of the electrode material. It is therefore sensitive to target wear which changes the physical dimensions of the target electrode 3, reactive sputtering and the use of poisoned target deposition which alters the target's surface condition/chemistry, or changes in the material being processed during deposition of layers onto the substrate being processed or removal of material from it.

To record the characteristic response of the plasma reactor, two states of the system are measured. Firstly, there is measurement of the plasma reactor with no power being delivered to the reactor and no plasma present in the reactor. Monitoring of the characteristic response of the plasma reactor to the perturbation signal can allow deviations from normal behaviour to be detected but not their source to be identified. The measurement configuration of the system 1 enables de-convolution of the contributions of the separate hardware components, forming the power delivery line 9 of the power delivery circuit, to the overall characteristic of the plasma reactor chamber. By changing the properties of hardware components (e.g. physical dimensions or wear) in a systematic way, their individual contribution to the overall response characteristic can be determined. For example, measurement before and after plasma processing (i.e. with no plasma present) reveals characteristic responses to the plasma treatment and/or electrode wear and this forms a mechanism for controlling the process. Additionally, where changes in chamber 4 hardware affect the characteristic response, the cause of these changes can then be identified from the knowledge of the separate hardware contributions.

Measurements made of the response of the reactor with plasma present enable measurement of the plasma process. This measurement is sensitive to changes in process inputs as well as the plasma reactor hardware forming part of the power delivery circuit (e.g. ground returns). The contribution of the power delivery line 9 is already known from the measurements without plasma present in the reactor. The addition of the plasma produces a response signal which is a construct of the two contributions e.g. for measurements with a scalar network analyser this response is the vector summation of the two contributions i.e. superposition of the two responses, while measurement with a vector network analyser measures the magnitude and phase of both responses. The shift in the frequency components of the perturbing signal provides a measure of the change in the electrical equivalent circuit. This change can therefore be calibrated or interpreted in terms of a physical change in the plasma or the plasma-surface interface.

Changes in the plasma due to variations in the process inputs (e.g. gas flow and composition, chamber pressure and power) are identified and associated with the respective change in process input. This is done in a systematic way using design-of-experiment methods. In this methodology characteristics of the process are measured for co-variant changes in a plurality of process inputs and the response associated with these changes correlated.

The response of the measured characteristic to variations in the hardware and/or process inputs and/or plasma facing surface condition is then used to both identify and classify changes when they occur.

This measurement technique allows measurement of the plasma system's characteristic response to be acquired for a plurality of frequencies or temporal responses. The potential range of frequencies to be measured is limited only by the technical limits of the source and acquisition means. This provides a large number of parameters to be analysed after collection. Analysis can be achieved by using multivariate methods to identify characteristic responses of system or fault conditions and subsequently monitoring the process performance relative to these known system or fault conditions.

The measurement and its systematic analysis allow the plurality of potential measurement frequencies to be minimised to those which are most relevant i.e. those which show responses to variations in the process, hardware and plasma facing surface changes. Multivariate analysis is one way of effectively minimising the plurality of measurement response parameters. Alternatively specific frequencies or bands of frequencies can be chosen which are sufficiently sensitive to changes (i.e. gated frequency bands). These can then be used to control the process using a diminished number of variables, such as specific frequency bands or harmonics of the modified perturbing signal.

Figure 2:
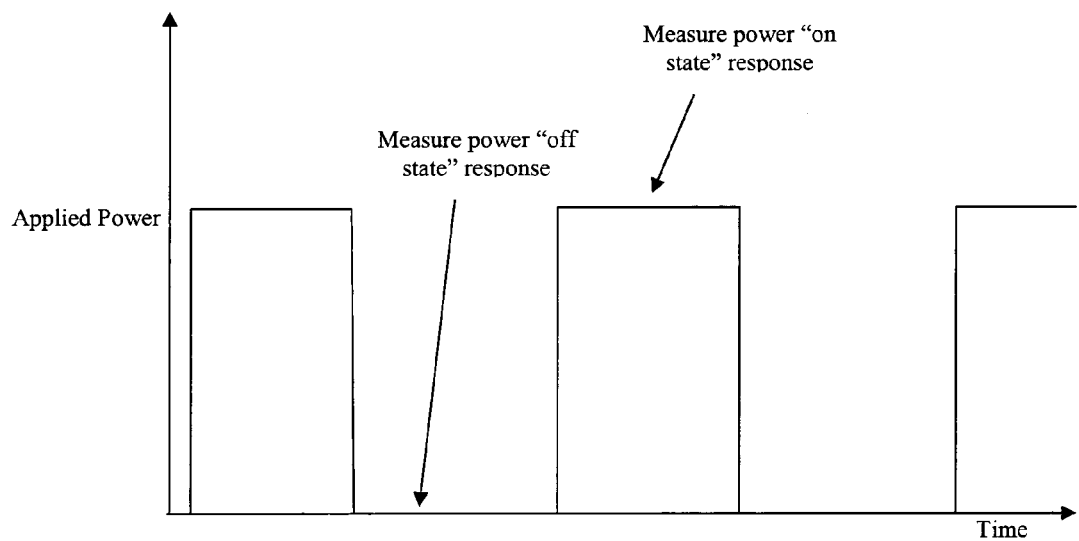
FIG. 2 is a waveform from a uni-polar pulsed power supply showing the points in the repetitive waveform where measurements are made of the response to the applied perturbation signal.

Measurements may be made with pulsed uni-polar DC power. In this case both power on and power off states can be measured synchronously and repetitively, as shown in FIG. 2. When the power is in an "off state" and the plasma has extinguished, measurements are made of the power delivery line and the incumbent stray capacitances. When the power pulse is applied and a plasma forms, measurements are made of the "on state" i.e. the response of the system already measured in the off state and the additional effect of the plasma and return paths of the power delivery circuit. The synchronous repetitive measurement of the response to the applied perturbation signal in each of the two states allows the response to a plurality of frequencies and/or perturbation signal forms (e.g. sinusoidal, sawtooth, pulsed) to be measured. The frequency range is limited by the length of on and off states of the process conditions used by the plasma rector system supplied by the uni-polar supply. The technique is also extendable to bipolar DC pulsed plasmas, the difference being that in this case two plasma "on states" are measured with different applied polarities.

Reflection Measurement from the Return Path

Figure 3:
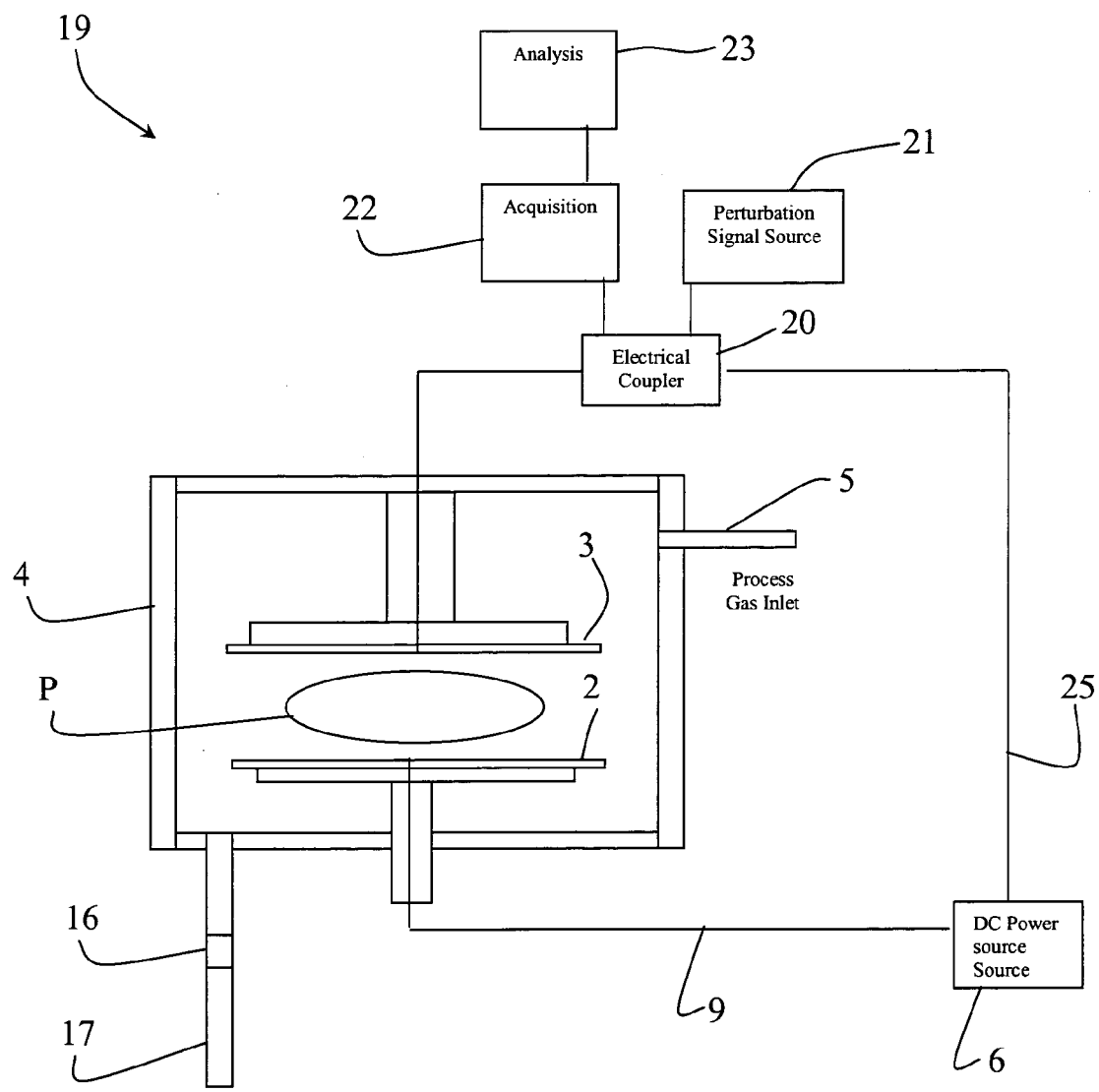
FIGS. 3 and 4 are diagrams illustrating alternative plasma systems of the invention.

An alternative embodiment is where the perturbation signal is introduced onto the return path of the power delivery circuit. Referring to FIG. 3 a system 19 is shown, having a coupler 20 in a return path 25. The coupler 20 is linked with a perturbation source 21, an acquisition system 22, and an analysis system 23. An example of this is where the material being processed is not the electrode and instead is part of the return circuit placed facing the powered electrode 2. This configuration allows the measurement means to record the response of the plasma reactor to the perturbation signal reflected from the return path and therefore to be more sensitive to changes in the processed material characteristics. The recorded response of the reactor to the perturbation signal is a measurement of the signal reflected from the return path.

Transmission Measurement

Figure 4:
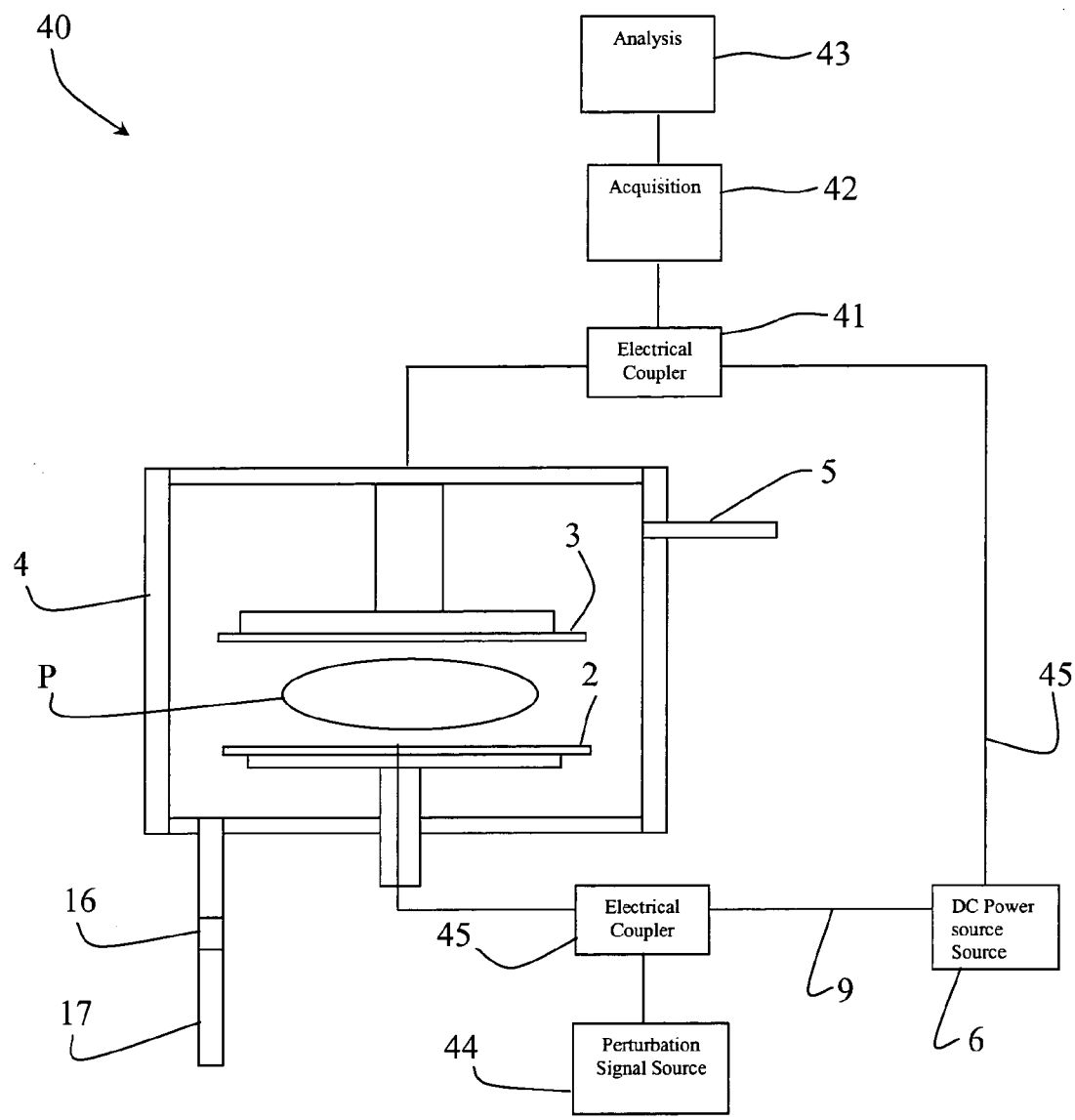

In one embodiment the perturbation signal is introduced onto the power delivery line 9 of the electrical circuit and the response is measured on the return path, as shown in FIG. 4. In this system, 40, a coupler 41 is on a return path 45, and it is linked with an acquisition system 42 and an analysis system 43. A perturbation source 44 is linked by a coupler 45 to the supply line 9. An example of this is where the material being processed is not the electrode and instead is part of the return circuit (often placed facing the powered electrode). This configuration allows the measurement means to record the response of the plasma reactor to the perturbation signal transmitted through the plasma. The recorded response of the system to the perturbation signal is a measurement of its transmission through the power delivery line, the plasma, and the return path.

In more detail, referring again to FIG. 1 as power is delivered to the electrode/target 2 by the power delivery line 9 the impedance of the delivery line 9 and electrode 2 is real i.e. resistive. Power is coupled to the gas that forms the plasma P through the electrode 2 and the coupling is capacitive. FIG. 1 shows only one electrode but the invention also applies to plasma reactor systems with one or more electrodes. Process gases are introduced into the plasma reactor chamber 4 through the gas inlet 5. The chamber is maintained at the desired pressure by a combination of the gas flow rates into the chamber and/or the use of the throttle valve 16 to control the rate of pumping used to exhaust the gases to the pump 15 through the exhaust line 17. The gas in the chamber 4 is required for the formation of the plasma to process the material. These processes include removal of material from the target electrode 2 and deposition of layers of this material onto the electrode 3, which is a set of substrates (commonly known as sputtering), the etching of material from substrate material and the surface modification of materials to change chemical properties of their surfaces.

Figure 5:
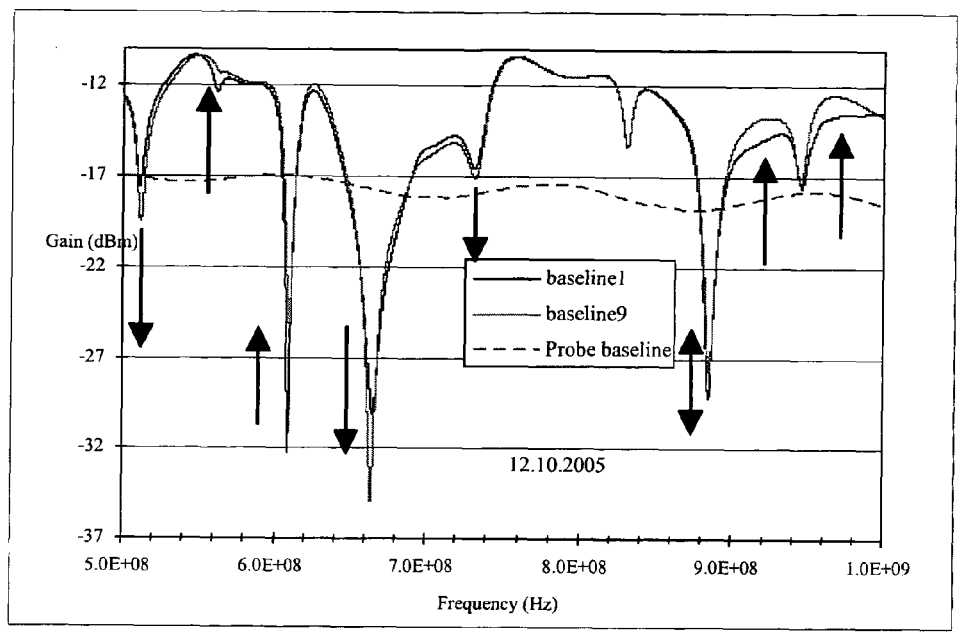
FIG. 5 is a plot of measurement of the frequency-dependent response of a target electrode to a sinusoidal perturbation signal before and after processing with a plasma, in which the change in signal is due to removal of material from the target surface.

The material to be processed is subjected to a standard recipe with specific process conditions for timing, gas flows, pressures, and power. The system introduces a radio frequency (RF) signal from the source 8 onto the power delivery line 9 through the electrical coupler 7. The acquisition system 10 measures the response of the power delivery circuit to the applied RF signal. Both the signal source 8 and the acquisition system 10 need not necessarily be separate. For example a vector or scalar network analyser would provide both functions in one unit. The signal source 8 is swept over a plurality of RF frequencies and the corresponding responses of the chamber 4 to that plurality of frequencies is recorded to produce a spectrum of the response (FIG. 5). If a vector network analyser is used this measures both magnitude and phase of the reactor response, a scalar network analyser only measuring the magnitude of the response. The invention does not require the collection of a continuous plurality of perturbation frequencies. Determination of one or more frequencies which are sensitive to variations in the process performance is all that is required.

A repetitive or non-repetitive signal perturbation source can be used to measure the time-dependant response of the plasma reactor to the applied perturbation. The acquisition electronics record the temporal response of the plasma reactor to the applied perturbation which may be sourced from a device such as a pulse generator or other arbitrary pulse source.

The response of the measurement is very sensitive to variations in the electrical hardware of the power delivery circuit. FIG. 5 shows the effect on the characteristic response of a target/electrode after plasma processing. The only effect of the processing has been to remove material from the surface of the target and the resultant change in the spectra after treatment is clear.

In order to control a plasma process using this measurement technique a number of steps are used to systematically characterise the contribution of the different components to the characteristic response of the plasma reactor to the perturbation signal.

Figure 6:
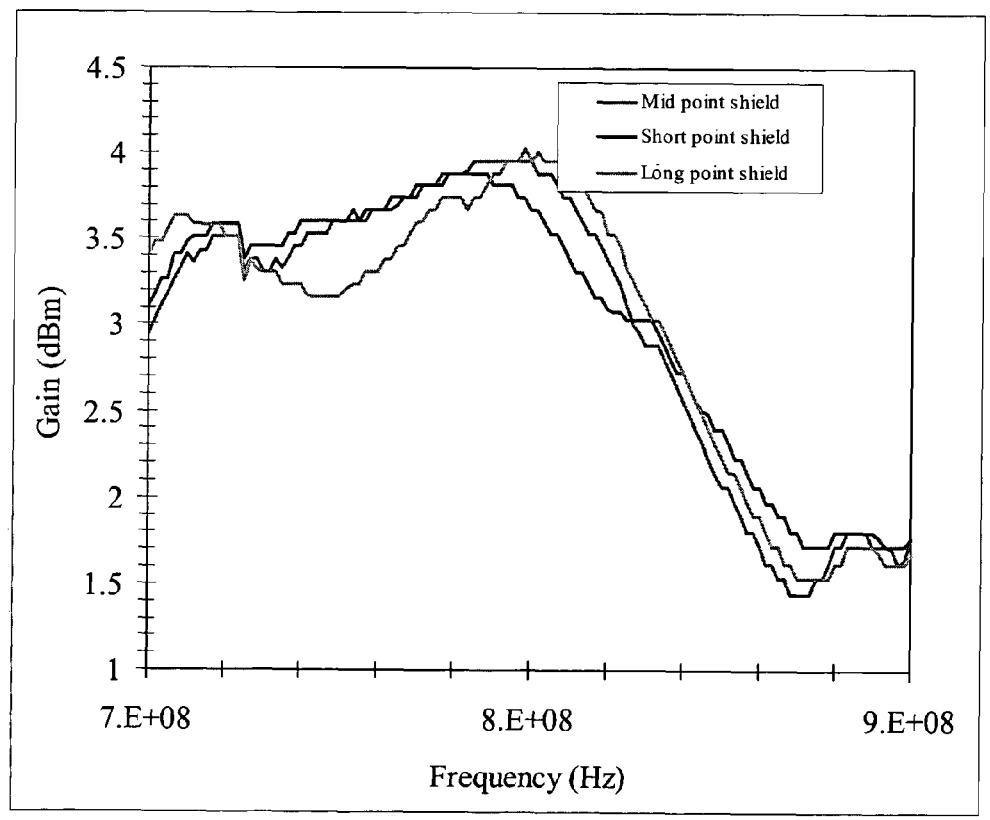
FIG. 6 is a measurement of the frequency dependant response of a perturbation signal from a plasma reactor with no plasma present and no power applied but with varying positions for the shield mounted around the electrode.

With no power delivered from the power supply 6 and no plasma P present in the chamber 4 measurements are made while systematically changing component parts of the hardware in order to simulate fault conditions e.g. electrode wear, power delivery line failure, contributors to stray capacitances around the power delivery line and electrode etc. FIG. 6 shows the effect of adjusting the position of the shield around the target of a DC magnetron sputtering chamber. This shield is not in direct electrical contact with the power delivery circuit but contributes to the complex loads (inductive and capacitive) coupled to the power delivery line. By measuring the unique response produced by the various hardware components the difference between normal behaviour and fault behaviour can be identified.

With power applied and resulting plasma formed in the chamber 4 the process inputs are varied systematically and the corresponding response behaviour measured. This can be condensed using design of experimental techniques to capture the maximum amount of variations with the minimum amount of measurements.

Figure 7:
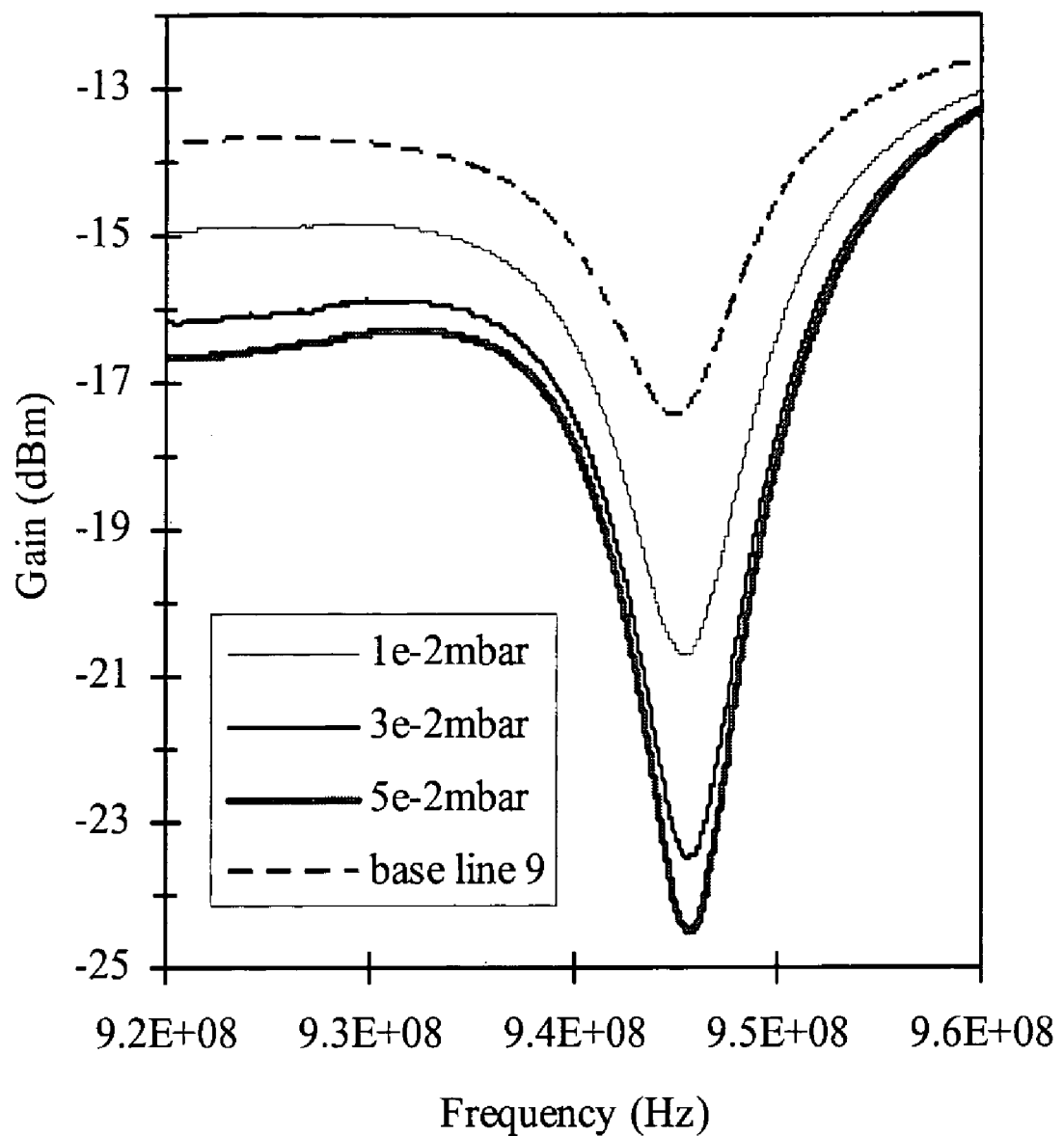
FIG. 7 is a measurement of the frequency dependant response of a perturbation signal from a plasma under various process condition settings for gas pressure.

FIG. 7 shows the response to a change in pressure while holding all other parameters fixed. The characteristic responses from the plurality of frequencies corresponding to both the hardware and process variations can be transformed using the analysis system 11 to provide a fault signature for each different system state. Where magnitudes of the fault are present (e.g. pressure variation) both the type and size of the fault can be assigned. In a production environment the operation of the plasma reactor is then monitored for variations from normal behaviour. These variations are identified and subsequently classified to provide identification of the source of the variation or fault to the user.

There are many potential variations of the invention. Similarly, whilst the invention is described in terms of an exemplary plasma reactor system comprising a plurality of different features and functions it will be appreciated that some of these features may be omitted or replaced and that the invention is not to be construed as requiring all of the described features and functions unless stated as such.

The invention is not limited to the embodiments described but may be varied in construction and detail.

The invention claimed is:

1. A plasma system comprising:
   a closed circuit including: a DC source connected to a power supply line feeding a first electrode, a second electrode and a return line from the second electrode to the DC power source,
   wherein the plasma system further comprises:
      a plasma reaction chamber housing said first and second electrodes;
      a perturbation signal source and a coupler for delivering an electrical perturbation signal into the circuit in addition to DC voltage from the DC source to said first electrode, and
      a measurement system connected to the circuit by a coupler, said measurement system being for measuring response to the electrical perturbation.

2. The plasma system as claimed in claim 1, wherein the measurement system is adapted to measure variation in impedance of the circuit.

3. The plasma system as claimed in claim 1, wherein the measurement system is adapted to measure phase between voltage and current in the circuit.

4. The plasma system as claimed in claim 1, wherein the measurement system is adapted to use a frequency domain reflectrometry technique to measure signal reflection modulus of a supply line of the circuit over a defined frequency range.

5. The plasma system as claimed in claim 1, wherein magnitude of the perturbation signal is small compared to the plasma driving signal.

6. The plasma system as claimed in claim 1, wherein the perturbation source is connected to the supply line.

7. The plasma system as claimed in claim 1, wherein the perturbation source is connected to the return line.

8. The plasma system as claimed in claim 1, wherein the measurement system is connected to the supply line.

9. The plasma system as claimed in claim 1, wherein the measurement system is connected to the return line.

10. The plasma system as claimed in claim 1, wherein said electrical perturbation signal coupler is adapted to block the DC power from the perturbation source.

11. The plasma system as claimed in claim 1, wherein the measurement system comprises:
   a vector network analyser for measuring both magnitude and phase of plasma reactor response, and
   a scalar network analyser for measuring magnitude of the response.

12. A method of measuring DC plasma conditions in a DC plasma system comprising:
   a closed circuit including: a DC source connected to a power supply line feeding a first electrode, a second electrode and a return line from the second electrode to the DC power source,
   wherein the plasma system further comprises:
      a plasma reaction chamber housing said first and second electrodes;
      a perturbation signal source and a coupler for delivering an electrical perturbation signal into the circuit in addition to DC voltage from the DC source to said first electrode, and
      a measurement system connected to the circuit by a coupler, said measurement system being for measuring response to the electrical perturbation;
   the method comprising the steps of:
      the DC source and the electrical perturbation signal source delivering both DC voltage and an electrical perturbation to the electrode to bring about a plasma reaction, and
      the measurement system measuring response to the electrical perturbation.

13. The method as claimed in claim 12, wherein variation in impedance of the circuit is measured by said measurement system.

14. The method as claimed in claim 12, wherein the electrodes are arranged to perform sputtering, and the method measures progress of sputtering by monitoring a variation induced in the perturbing signal and correlating it with process variations.

15. The method as claimed in claim 14, wherein said variations include sputtering electrode target surface condition, or process pressure.

16. The method as claimed in claim 12, comprising the step of measuring shift in frequency components of the perturbing signal.

17. The method as claimed in claim 16, comprising the step of the measurement system calibrating the plasma system in response to measurement of said shifts.

18. The method as claimed in claim 16, comprising the step of the measurement system interpreting said measurements to provide an indication of a physical change in plasma or in a plasma-surface interface.

19. The method as claimed in claim 12, wherein when delivered power is in an off state and plasma has extinguished the power delivery line in said off state is measured, and when a power pulse is delivered and plasma is formed the power delivery line in said on state is measured to provide an indication of the response of the reactor to this change.

20. The method as claimed in claim 12, wherein the measurement system records the response of the plasma reactor to the perturbation signal reflected from the return path to achieve sensitivity to changes in the processed materials characteristics.

21. The method as claimed in claim 12, wherein with no power delivered from the power supply and no plasma present in the chamber measurements are made while systematically changing component parts of the hardware in order to simulate fault conditions.

22. The method as claimed in claim 21, wherein the measurement system comprises a vector network analyser and said analyser measures both magnitude and phase of the plasma reactor response, and a scalar network analyser which measures the magnitude of the response.

23. The method as claimed in claim 21, wherein said fault conditions include electrode wear, power delivery line failure, and contributors to stray capacitances around the power delivery line and the electrode.

24. The method as claimed in claim 12, comprising the step of the measurement system measuring reactor characteristic response to a plurality of perturbation signal frequencies caused by sweeping of the perturbation signal.

* * * * *